(12) United States Patent
Ayers

(10) Patent No.: US 7,875,315 B2
(45) Date of Patent: Jan. 25, 2011

(54) POROUS INORGANIC SOLIDS FOR USE AS LOW DIELECTRIC CONSTANT MATERIALS

(75) Inventor: Michael Raymond Ayers, Palm Coast, FL (US)

(73) Assignee: Roskilde Semiconductor LLC, Las Vegas, NV (US)

( * ) Notice: Subject to any disclaimer, the term of this patent is extended or adjusted under 35 U.S.C. 154(b) by 600 days.

(21) Appl. No.: 11/806,464

(22) Filed: May 31, 2007

(65) Prior Publication Data

US 2008/0020197 A1    Jan. 24, 2008

Related U.S. Application Data

(60) Provisional application No. 60/809,401, filed on May 31, 2006.

(51) Int. Cl.
*B05D 3/02* (2006.01)
*B05D 3/06* (2006.01)

(52) U.S. Cl. .................. 427/331; 427/569; 427/576; 427/577; 427/578; 427/579; 427/243; 427/384

(58) Field of Classification Search .................. None
See application file for complete search history.

(56) References Cited

U.S. PATENT DOCUMENTS

| | | | |
|---|---|---|---|
| 4,652,467 A | 3/1987 | Brinker et al. | |
| 4,987,101 A | 1/1991 | Kaanta et al. | |
| 5,103,288 A | 4/1992 | Sakamoto et al. | |
| 5,145,546 A | 9/1992 | Yuasa et al. | |
| 5,177,248 A | 1/1993 | Chiang et al. | |
| 5,294,732 A | 3/1994 | Chiang et al. | |
| 5,308,481 A | 5/1994 | Stalling et al. | |
| 5,338,571 A * | 8/1994 | Mirkin et al. | ............... 427/299 |
| 5,364,993 A * | 11/1994 | Zhang et al. | ............... 570/187 |
| 5,386,048 A * | 1/1995 | West et al. | ............... 556/430 |
| 5,416,188 A | 5/1995 | Chiang et al. | |
| 5,420,081 A | 5/1995 | Mattes et al. | |
| 5,470,820 A | 11/1995 | Hauser et al. | |
| 5,494,859 A | 2/1996 | Kapoor | |
| 5,679,861 A | 10/1997 | Kuo et al. | |
| 5,698,140 A | 12/1997 | Lamb et al. | |
| 5,739,376 A | 4/1998 | Bingel | |
| 5,744,399 A | 4/1998 | Rostoker et al. | |
| 5,801,092 A | 9/1998 | Ayers | |

(Continued)

FOREIGN PATENT DOCUMENTS

EP    0 647 606 A1    4/1995

(Continued)

OTHER PUBLICATIONS

Bell et al, Proceedings—Electrochemical Society (1994), 92-94, pp. 92-106.*

(Continued)

*Primary Examiner*—Erma Cameron
(74) *Attorney, Agent, or Firm*—Sterne Kessler Goldstein & Fox

(57) ABSTRACT

This disclosure relates generally to polymeric networks of fullerene compounds, to methods of preparing precursors for such networks, and to their subsequent use as low dielectric constant materials in microelectronic devices.

15 Claims, 5 Drawing Sheets

U.S. PATENT DOCUMENTS

| | | | |
|---|---|---|---|
| 5,851,503 A | 12/1998 | Mitani et al. | |
| 6,066,272 A | 5/2000 | Tang et al. | |
| 6,083,624 A | 7/2000 | Hiura | |
| 6,187,427 B1 | 2/2001 | Taylor-Smith et al. | |
| 6,214,746 B1 | 4/2001 | Leung et al. | |
| 6,255,241 B1 | 7/2001 | Miyazawa et al. | |
| 6,277,766 B1 * | 8/2001 | Ayers | 438/778 |
| 6,287,979 B1 | 9/2001 | Zhou et al. | |
| 6,342,454 B1 | 1/2002 | Hawker et al. | |
| 6,368,569 B1 | 4/2002 | Haddon et al. | |
| 6,380,270 B1 | 4/2002 | Yates | |
| 6,423,811 B1 | 7/2002 | Lau et al. | |
| 6,495,479 B1 | 12/2002 | Wu et al. | |
| 6,599,492 B2 | 7/2003 | Iwamura et al. | |
| 6,621,970 B2 | 9/2003 | Khudyakov et al. | |
| 6,713,590 B2 | 3/2004 | Lau et al. | |
| 6,743,481 B2 | 6/2004 | Hoehn et al. | |
| 6,790,790 B1 | 9/2004 | Lyons et al. | |
| 6,797,777 B2 | 9/2004 | Lau et al. | |
| 6,855,202 B2 | 2/2005 | Alivisatos et al. | |
| 6,967,222 B2 | 11/2005 | Khanarian et al. | |
| 6,984,265 B1 | 1/2006 | Raguse et al. | |
| 6,987,147 B2 | 1/2006 | Lau et al. | |
| 6,998,178 B2 | 2/2006 | Apen et al. | |
| 7,011,890 B2 | 3/2006 | Nguyen et al. | |
| 7,014,681 B2 | 3/2006 | Noack et al. | |
| 7,060,204 B2 | 6/2006 | Li et al. | |
| 7,338,812 B2 | 3/2008 | Lin et al. | |
| 7,531,209 B2 * | 5/2009 | Ayers | 427/230 |
| 2001/0016608 A1 | 8/2001 | Haddon et al. | |
| 2001/0041801 A1 | 11/2001 | Friedman et al. | |
| 2002/0016414 A1 | 2/2002 | Lau et al. | |
| 2002/0037941 A1 | 3/2002 | Lau et al. | |
| 2002/0061397 A1 | 5/2002 | Iwamura et al. | |
| 2003/0072947 A1 | 4/2003 | Lee et al. | |
| 2003/0151031 A1 | 8/2003 | Li et al. | |
| 2003/0162002 A1 | 8/2003 | Lau et al. | |
| 2003/0187139 A1 | 10/2003 | Lau et al. | |
| 2003/0213958 A1 | 11/2003 | Nakagawa et al. | |
| 2004/0046155 A1 | 3/2004 | Li et al. | |
| 2004/0102584 A1 | 5/2004 | Lau et al. | |
| 2004/0132846 A1 | 7/2004 | Leventis et al. | |
| 2004/0175568 A1 | 9/2004 | Takaguchi | |
| 2004/0175581 A1 | 9/2004 | Nguyen et al. | |
| 2004/0180201 A1 | 9/2004 | Veedu et al. | |
| 2004/0250750 A1 | 12/2004 | Reda et al. | |
| 2005/0020702 A1 | 1/2005 | Li et al. | |
| 2005/0238889 A1 | 10/2005 | Iwamoto et al. | |
| 2005/0263908 A1 | 12/2005 | Nakagawa et al. | |
| 2005/0279399 A1 | 12/2005 | Gaudiana et al. | |
| 2006/0024502 A1 | 2/2006 | McFarland et al. | |
| 2006/0071300 A1 | 4/2006 | Haverty et al. | |
| 2006/0093885 A1 | 5/2006 | Krusic et al. | |
| 2006/0106152 A1 | 5/2006 | Metzinger et al. | |
| 2006/0155376 A1 * | 7/2006 | Asgari | 623/16.11 |
| 2006/0175685 A1 | 8/2006 | Shin et al. | |
| 2006/0185794 A1 | 8/2006 | Ayers | |
| 2009/0192281 A1 | 7/2009 | Ayers | |

FOREIGN PATENT DOCUMENTS

| | | |
|---|---|---|
| EP | 1 015 384 B1 | 7/2000 |
| EP | 1 063 197 A2 | 12/2000 |
| EP | 1 190 422 B1 | 3/2002 |
| EP | 1 244 731 B1 | 10/2002 |
| EP | 1 265 080 A2 | 12/2002 |
| EP | 1 473 770 A1 | 11/2004 |
| GB | 2 380 496 A | 4/2003 |
| JP | 5-254955 A | 10/1993 |
| JP | 6-324681 A | 11/1994 |
| JP | 8-181133 A | 7/1996 |
| JP | 8-245209 A | 9/1996 |
| JP | 9-316202 A | 12/1997 |
| JP | 10-310709 A | 11/1998 |
| JP | 11-263916 A | 9/1999 |
| JP | 2000-154191 A | 6/2000 |
| JP | 2000-268632 A | 9/2000 |
| JP | 2001-192322 A | 7/2001 |
| JP | 2002-6478 A | 1/2002 |
| JP | 2002-72964 A | 3/2002 |
| JP | 2003-3047 A | 1/2003 |
| JP | 2003-3119 A | 1/2003 |
| JP | 2003-176113 A | 6/2003 |
| JP | 2003-280249 A | 10/2003 |
| JP | 2003-321214 A | 11/2003 |
| JP | 2004-182771 A | 7/2004 |
| JP | 2005-53832 A | 3/2005 |
| JP | 2005-105152 A | 4/2005 |
| JP | 2005-119167 A | 5/2005 |
| JP | 2005-144601 A | 6/2005 |
| JP | 2005-263509 A | 9/2005 |
| JP | 2005-268550 A | 9/2005 |
| JP | 2005-272639 A | 10/2005 |
| JP | 2005-289755 A | 10/2005 |
| JP | 2005-290316 A | 10/2005 |
| WO | WO 00/68956 A1 | 11/2000 |
| WO | WO 01/25316 A1 | 4/2001 |
| WO | WO 01/78110 A2 | 10/2001 |
| WO | WO 01/91922 A2 | 12/2001 |
| WO | WO 02/06366 A1 | 1/2002 |
| WO | WO 02/30814 A1 | 4/2002 |
| WO | WO 02/081546 A1 | 10/2002 |
| WO | WO 03/018645 A1 | 3/2003 |
| WO | WO 03/057749 A1 | 7/2003 |
| WO | WO 03/060979 A2 | 7/2003 |
| WO | WO 03/061029 A2 | 7/2003 |
| WO | WO 2004/000909 A1 | 12/2003 |
| WO | WO 2004/079814 A2 | 9/2004 |
| WO | WO 2005/008761 A1 | 1/2005 |
| WO | WO 2005/010071 A1 | 2/2005 |
| WO | WO 2005/028174 A2 | 3/2005 |
| WO | WO 2006/023921 A2 | 3/2006 |
| WO | WO 2006/028704 A2 | 3/2006 |
| WO | WO 2006/028776 A1 | 3/2006 |

OTHER PUBLICATIONS

International Search Report completed for Application No. PCT/US07/12836 on Sep. 20, 2007 and mailed on Nov. 5, 2007.

International Search Report completed for Application No. PCT/US07/12835 on Oct. 3, 2007 and mailed on Nov. 28, 2007.

International Search Report completed for Application No. PCT/US07/12831 on Oct. 19, 2007 and mailed on Dec. 5, 2007.

Non-Final Office Action issued in the co-pending U.S. Appl. No. 10/906,534 on Nov. 27, 2007.

International Search Report completed for Application No. PCT/US07/12832 on Oct. 24, 2007 and mailed on Dec. 18, 2007.

Chen, K., et al., "Fullerene Self-Assembly onto $(MeO)_3Si(CH_2)_3NH_2$-Modified Oxide Surfaces," *J. Am. Chem. Soc.* 115:1193-1194, American Chemical Society (1993).

Hirsch, A., et al., "Globe-trotting Hydrogens on the Surface of the Fullerene Compound $C_{60}H_6(N(CH_2CH_2)_2O)_6$," *Angew. Chem. Int. Ed. Engl.* 30:1309-1310, VCH Verlagsgesellschaft mbH (1991).

Hirsch, A., et al., "Regioselective Multiple Additions to Buckminsterfullerene," in *The Chemical Physics of Fullerenes 10 (and 5) Years Later*, Andreoni, W., ed., Kluwer Academic Publishers, Boston, MA, pp. 267-283 (1996).

Jenekhe, S.A., and Chen, X.L., "Self-Assembly of Ordered Microporous Materials from Rod-Coil Block Copolymers," *Science* 283:372-375, American Association for the Advancement of Science (1999).

Liang, C., et al., "Synthesis of a Large-Scale Highly Ordered Porous Carbon Film by Self-Assembly of Block Copolymers," *Angew. Chem. Int. Ed.* 43:5785-5789, Wiley-VCH Verlag GmbH & Co. KGaA (Nov. 2004).

Maggini, M., et al., "$C_{60}$ Derivatives Embedded in Sol-Gel Silica Films," *Adv. Mater.* 7:404-406, VCH Verlagsgesellschaft mbH (1995).

Ouyang, J., et al., "Structures and Properties of Supramolecular Assembled Fullerenol/Poly(dimethylsiloxane) Nanocomposites," *J. Phys. Chem. B* 108:5937-5943, American Chemical Society (May 2004).

Wudl, F., et al., "Survey of Chemical Reactivity of $C_{60}$, Electrophile and Dieno-polarophile Par Excellence," in *ACS Symposium Series—Fullerenes*, Hammond, G.S., and Kuck, V.J., eds., American Chemical Society, Washington, DC, pp. 161-175 (1992).

Yevlampieva, N., et al., "Star-like Fullerene Containing Poly(Vinylpyrrolydone) Derivatives: Chloroform Solution Properties," *Fullerenes, Nanotubes, and Carbon Nanostructures* 12:353-359, Marcel Dekker, Inc. (Aug. 2004).

Patent Abstracts of Japan, unverified English language abstract for JP 5-254955 A, 1993.
Patent Abstracts of Japan, unverified English language abstract for JP 6-324681 A, 1994.
Patent Abstracts of Japan, unverified English language abstract for JP 8-181133 A, 1996.
Patent Abstracts of Japan, unverified English language abstract for JP 8-245209 A, 1996.
Patent Abstracts of Japan, unverified English language abstract for JP 9-316202 A, 1997.
Patent Abstracts of Japan, unverified English language abstract for JP 11-0263916 A, 1999.
Patent Abstracts of Japan, unverified English language abstract for JP 10-310709 A, 1998.
Patent Abstracts of Japan, unverified English language abstract for JP 2000-154191 A, 2000.
Patent Abstracts of Japan, unverified English language abstract for JP 2000-268632 A, 2000.
Patent Abstracts of Japan, unverified English language abstract for JP 2001-192322 A, 2001.
Patent Abstracts of Japan, unverified English language abstract for JP 2002-6478 A, 2002.
Patent Abstracts of Japan, unverified English language abstract for JP 2002-72964 A, 2002.
Patent Abstracts of Japan, unverified English language abstract for JP 2003-3047 A, 2003.
Patent Abstracts of Japan, unverified English language abstract for JP 2003-3119 A, 2003.
Patent Abstracts of Japan, unverified English language abstract for JP 2003-176113 A, 2003.
Patent Abstracts of Japan, unverified English language abstract for JP 2003-280249 A, 2003.
Patent Abstracts of Japan, unverified English language abstract for JP 2003-321214 A, 2003.
Patent Abstracts of Japan, unverified English language abstract for JP 2004-182771 A, 2004.
Patent Abstracts of Japan, unverified English language abstract for JP 2005-53832 A, 2005.
Patent Abstracts of Japan, unverified English language abstract for JP 2005-105152 A, 2005.
Patent Abstracts of Japan, unverified English language abstract for JP 2005-119167 A, 2005.
Patent Abstracts of Japan, unverified English language abstract for JP 2005-144601 A, 2005.
Patent Abstracts of Japan, unverified English language abstract for JP 2005-263509 A, 2005.
Patent Abstracts of Japan, unverified English language abstract for JP 2005-268550 A, 2005.
Patent Abstracts of Japan, unverified English language abstract for JP 2005-272639 A, 2005.
Patent Abstracts of Japan, unverified English language abstract for JP 2005-289755 A, 2005.
Patent Abstracts of Japan, unverified English language abstract for JP 2005-290316 A, 2005.
Dialog File 351, Accession No. 7111280, unverified English language abstract for EP 0 647 606 A1, 1995.

Jena, P., and Khanna, S.N., "Physics of cluster assembled materials," *Mater. Sci. Eng.* A217/A218:218-222, Elsevier Science S.A. (1996).

Matsuura, M., et al., "On the role of small additives for nanocrystalline formation from amorphous matrix," *Mater. Sci. Eng.* A217/A218:397-400, Elsevier Science S.A. (1996).

Ohno, K., et al., "Ab-initio molecular dynamics study of the stability and reactivity of $C_{60}$," *Mater. Sci. Eng.* A217/A218:19-22, Elsevier Science S.A. (1996).

Co-pending U.S. Appl. No. 11/806,463, inventor Ayers, M.R., filed May 31, 2007.
Co-pending U.S. Appl. No. 11/806,482, inventor Ayers, M.R., filed May 31, 2007.
Co-pending U.S. Appl. No. 11/806,465, inventor Ayers, M.R., filed May 31, 2007.
Non Final Office Action in U.S. Appl. No. 11/806,465, mailed Oct. 20, 2010, 6 pgs.
Non Final Office Action in U.S. Appl. No. 12/418,314, mailed Sep. 29, 2010, 7 pgs.
Xia et al., Proceedings of SPIE, 3136, 1997, pp. 57-61.
Ulug et al., Fullerene Science and Technology, 5(7), 1997, pp. 1651-1658.
Wang, Tetrahedron, 58, 2002, pp. 2377-2380.
Office Action from Examiner Fletcher in parent U.S. Appl. No. 10/906,534, mailed on Nov. 27, 2007.
Office Action from Examiner Fletcher in related parent U.S. Appl. No. 10/906,534, mailed on Jun. 30, 2008.
Non Final Office Action in U.S. Appl. No. 11/806,463, mailed Jan. 20, 2010, 8 pgs.
Final Office Action in U.S. Appl. No. 11/806,463, mailed May 5, 2010, 8 pgs.
Non Final Office Action in U.S. Appl. No. 11/806,465, mailed Apr. 6, 2010, 8 pgs.
Final Office Action in U.S. Appl. No. 11/806,465, mailed Jul. 14, 2010, 7 pgs.
Non Final Office Action in U.S. Appl. No. 11/806,482, mailed Jan. 27, 2010, 6 pgs.

\* cited by examiner

POROUS INORGANIC SOLIDS FOR USE AS LOW DIELECTRIC CONSTANT MATERIALS

CROSS REFERENCE TO RELATED APPLICATIONS

This application claims the benefit of U.S. Provisional Patent Application No. 60/809,401, filed May 31, 2006, the disclosure of which is incorporated by reference herein in its entirety.

BACKGROUND

Field of the Invention

This disclosure relates generally to fullerene-comprising compounds, methods of preparing such compounds, and to their subsequent use as low dielectric constant materials in microelectronic devices.

BRIEF SUMMARY OF THE INVENTION

In one embodiment, the present invention provides methods of producing a porous film. For example, a polyfunctional fullerene monomer comprising at least one reactive arm is provided. The polyfunctional fullerene monomer is condensed to form a partially condensed fullerene oligomer. Then, the fullerene oligomer is combined with an inorganic oxide precursor (e.g., poly(ethoxysilane)) to form a composite mixture. The composite mixture to a substrate and then cured. Then, at least a portion of the fullerene oligomer is removed.

In exemplary embodiments, the polyfunctional fullerene monomers comprise a fullerene and at least one reactive arm which comprises: a reactive group coupled to the fullerene; an organic spacer portion; and a metal or metalloid alkoxide. Exemplary fullerenes include $C_{60}$ fullerene. Suitably, the reactive arms comprise an amine, an azide, a diene or a carbanion; an alkyl organic spacer portion; and a metal or metalloid alkoxide selected from the group consisting of —Si$(OR)_3$, —Ge$(OR)_3$ —Ti$(OR)_3$, —Zr$(OR)_3$, —Sn$(OR)_3$, —Al$(OR)_2$ and —B$(OR)_2$. Exemplary reactive arms include, but are not limited to, 3-aminopropyltrimethoxysilane, 3-aminopropyltriethoxysilane, 2-aminoethyl-3-aminopropyltrimethoxysilane, 2-aminoethyl-3-aminopropyl-triethoxysilane, diethylenetriaminopropyltrimethoxysilane, hexanediaminomethyltriethoxysilane and 11-aminoundecyltriethoxysilane.

In suitable embodiments, the condensing comprises contacting the polyfunctional fullerene monomer with water, and the applying comprises spin-coating, dip-coating or spray-coating. Suitably, curing comprises heating to between about 80° C. to 200° C. under a moist atmosphere. In some embodiments, curing comprises heating a composite mixture to greater than about 80° C. Exemplary methods of removing the oligomers include oxidation treatments such as, thermal oxidation, oxonolysis and oxygen plasma treatment. In some embodiments, removing comprises heating a composite mixture to greater than about 300° C. in the presence of oxygen.

In additional embodiments, methods of producing a porous film are provided. In suitable embodiments, a plurality of $C_{60}$ fullerenes are provided. Aminohexyltriethoxysilane is then added to the fullerenes, wherein amino groups of the aminohexyltriethoxysilane react with the fullerenes to generate functionalized fullerenes. Water is then added to the functionalized fullerenes, thereby condensing silane groups of the aminohexyltriethoxysilane to generate condensed fullerene oligomers. The fullerene oligomers are then combined with poly(ethoxysilane) to form a composite mixture. The mixture is then applied to a substrate, cured, and then at least a portion of the fullerene oligomers are removed. Exemplary substrates include silicon wafers. In further embodiments, films, including films produced by the methods of the present invention, are provided.

BRIEF DESCRIPTIONS OF THE DRAWINGS

DETAILED DESCRIPTION

Figure 1:
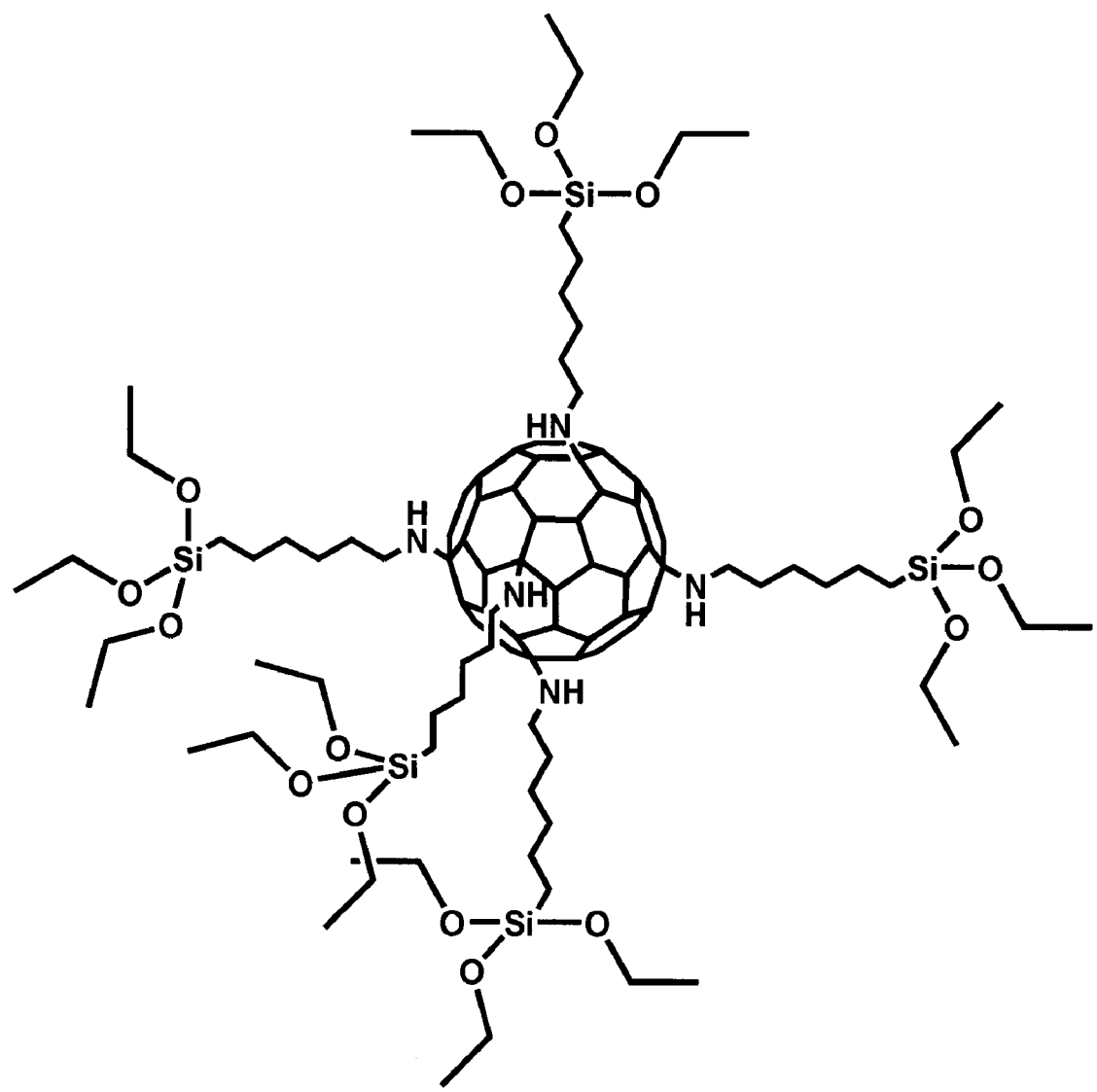
FIG. 1 shows an example of a polyfunctional fullerene monomer.

The derivatized fullerene monomers of the present invention are used as precursors to porogen-forming polymers in composite structures. They are well-suited for forming highly crosslinked three-dimensional networks and include a central core consisting of a fullerene that is subsequently derivatized by a plurality of radial arms. Such derivatized fullerene molecules possess a high solubility in common solvents and the ability to form three-dimensional network polymers upon condensation with adjacent clusters.

The present invention also relates to methods for forming a block-copolymer structure derived from the fullerene monomers and a suitable inorganic polymer precursor, comprising depositing the resulting composite structure as a film on a desired substrate, curing the film to form a bonded composite structure, and subsequently removing the fullerene-containing porogen to yield a porous inorganic film. Such films are useful as intra- or interlayer dielectrics for microelectronic devices. Any preparative route that produces a similar soluble, reactive fullerene monomer, where the core is symmetrically surrounded by multiple arms each terminated by a reactive group may be used. In one example, a method involves the use of a bifunctional coupling agent to form the arms including, at one end an amine group and at the opposite end a metal- or metalloid-alkoxide. Any coupling agent capable of both reacting with a fullerene and undergoing condensation reactions with other identical coupling agents may be used.

The fullerene core of the organic phase precursor monomers includes, but is not limited to one or more of the following: $C_{60}$, $C_{70}$, $C_{72}$, $C_{74}$, $C_{76}$, $C_{78}$, $C_{84}$, $C_{96}$, and higher analogues up to, and beyond, $C_{184}$ or mixtures thereof. Commercially available mixtures of $C_{60}$ and $C_{70}$, commonly know as Fullerite, fullerene extract, or fullerene soot may also be employed in various embodiments of the present invention.

Many possible compounds that are well-suited to form the reactive arms of the organic phase precursor monomers are readily available. The reactive arms include three general parts; a terminal group known to react with fullerenes, a linear organic spacer, and an opposing terminal group capable of undergoing multiple condensation reactions, or which is cross-linkable, with similar groups.

Any terminal group capable of forming covalent bonds with the fullerene core may be used. For example, terminal groups to couple the arms to the fullerene core include a primary or secondary amine. Amines are known to those skilled in the art to react with fullerenes in a facile manner by nucleophilic addition reactions across one of the many delocalized bonds of the fullerene cage. Anywhere from one to twelve amine molecules may be added to a single $C_{60}$ molecule, the actual number depending largely on their stearic bulk. One example being six. Other reactive groups, especially other nucleophiles, may be used, which include, but are not limited to azides, dienes, and carbanions.

The organic-spacer portion of the coupling agent may be any spacer group capable of connecting the terminal groups. For example, the spacer groups include, but are not limited to an alkyl chain, a polyether chain, a polyunsaturated alkyl chain, or an amine-containing alkyl chain. In one example, the organic spacer is an alkyl chain 3-20 carbon units long, alternatively 3-7 carbon units long. The spacer chain may include one or more heteroatomic groups, such as ether groups or amino groups, and optionally, may further include one or more rigid components, including, but not limited to alkynyl-segments, aryl-segments, or other cyclic segments.

Terminal reactive group used for linking the organic phase monomers to each other and to the other components of the composite structure may be any cross-linkable group. For example, cross-linkable terminal group include, but are not limited to metal- or metalloid-alkoxides. Alkoxides are well known in the art to readily undergo hydrolysis and condensation reactions, forming polymeric oxides, and to bond with, upon hydrolysis, the chemically similar surfaces of solid oxides. Any one of numerous possible alkoxide groups may be used according to the present disclosure, including, but not limited to, $-Si(OR)_3$, $-Ge(OR)_3$ $-Ti(OR)_3$, $-Zr(OR)_3$, $-Sn(OR)_3$, $-Al(OR)_2$, $-B(OR)_2$. In one example, as silica is a well known dielectric material, an example of a terminal group is $-Si(OR)_3$.

The following are non-limiting examples of commercially available coupling agents which can be used in the practice of the present invention: 3-aminopropyltrimethoxysilane, 3-aminopropyltriethoxysilane, 2-aminoethyl-3-aminopropyltrimethoxysilane, 2-aminoethyl-3-aminopropyltriethoxysilane, diethylenetriaminopropyltrimethoxysilane, hexanediaminomethyltriethoxysilane, 11-aminoundecyltriethoxysilane. However, numerous additional compounds may prove useful.

The organic phase precursor monomer may be prepared as follows. The desired amount of the selected fullerene core is added to a large excess of the selected coupling agent. Initially, the fullerene is insoluble in the coupling agent and is present as a fine black suspension. Reaction of the amine group of the coupling agent with the fullerene occurs readily at ambient temperature; however, heating the mixture to 50-60° C. allows the reaction to proceed at a more desirable rate. As the reaction proceeds, the partially derivatized fullerenes exhibit increased solubility in the coupling agent and the mixture exists as a dark brown solution. After approximately 18 hours, the formation of the organic phase precursor monomer is complete, with the maximum number of coupling agents, typically six, being added to the fullerene core. The unreacted coupling agent is removed using vacuum-distillation and recovered for use in future preparations, leaving a deep brown-black residue containing the organic phase precursor monomer. An example of such a compound, derived from $C_{60}$ and 6-aminohexyltriethoxysilane is shown in FIG. 1.

The derivatized fullerene monomers possess a high solubility in many common organic solvents, including alkanes, toluene, benzene, ketones, and alcohols. Examples of alcohols for use in the present invention include, but are not limited to ethanol and 2-propanol, which are solvents employed for the deposition of spin-on inorganic films in the microelectronics industry. The residue prepared as above may be redissolved in a solvent suitable for application to the desired substrate, such as ethanol.

Precursor monomers of the present invention may form multiple strong bonds to neighboring monomers, the inorganic phase of the composite, and to the common substrates encountered in microelectronic structures. These substrates include, but are not limited to oxides and metals, two classes of materials that form strong bonds to films containing alkoxides. Excellent film adhesion is a property that a successful dielectric material suitably possesses. With multiple reactive groups per cluster, both the organic phase precursors as well as the inorganic phase precursors may form strong bonds to a given substrate. This factor will reduce the likelihood of film delamination during subsequent process steps.

The inorganic phase that forms the composite matrix and subsequently the final porous dielectric film, is an inorganic oxide. Any precursor capable of forming the desired oxide phase may be employed. Examples include, but are not limited to silica, a hydro-silsequioxane, or an organo-silsequioxane. Alternative examples include silicon alkoxides. Any silicon alkoxide, or mixtures of silicon alkoxides, may be employed according to the present disclosure. Specific examples of silicon alkoxides include, but are not limited to tetraethoxysilane (TEOS), tetramethoxysilane (TMOS), methyltriethoxysilane or phenyltriethoxysilane.

One, or alternatively, both of the organic and inorganic phase precursors may be precondensed to form oligomeric precursors prior to their subsequent incorporation into the composite structure. This enhances the distribution of the two phases within the composite structure. Composites prepared from oligomeric precursors are more likely to form the desired situation where each phase is present as a continuous network conterminous with the other phase. This may also be described as a block-copolymer-type structure.

Precondensation of the inorganic phase may be accomplished by hydrolysis and condensation of the alkoxide precursor using a substoichiometric amount of water. Various precondensed polysilicate solutions are commercially available for use in a variety of fields.

The precondensation of the organic phase precursor is accomplished by reaction with a controlled amount of water. Any amount of water may be used in precondensing the organic phase. Large amounts of water may tend to form larger polymer fragments. The amount of water required to form the smallest possible oligomer, namely the linkage of two monomers together, is 0.5 mol per mol of monomer. Conversely, the amount of water required to affect complete hydrolysis and condensation of the terminal alkoxides, producing a fully-formed network, is 9.0 mol per mol of monomer when the average number of reactive arms is six. In one example, to keep fragments from growing too large, 0.75-2.0 mol of water per mol of monomer is used.

The precondensation step is accomplished by adding the desired amount of water to a solution of monomer in a suitable solvent, such as ethanol. If the reactive arms contain amine functionalities, the resulting increased pH will catalyze the hydrolysis and condensation of the alkoxides. However, additional amounts of acid or base catalysts may be added if desired. Typical reaction times for this process are 24-48 hours, though the rate of reaction can be accelerated by increasing the reaction temperature.

Figure 2:
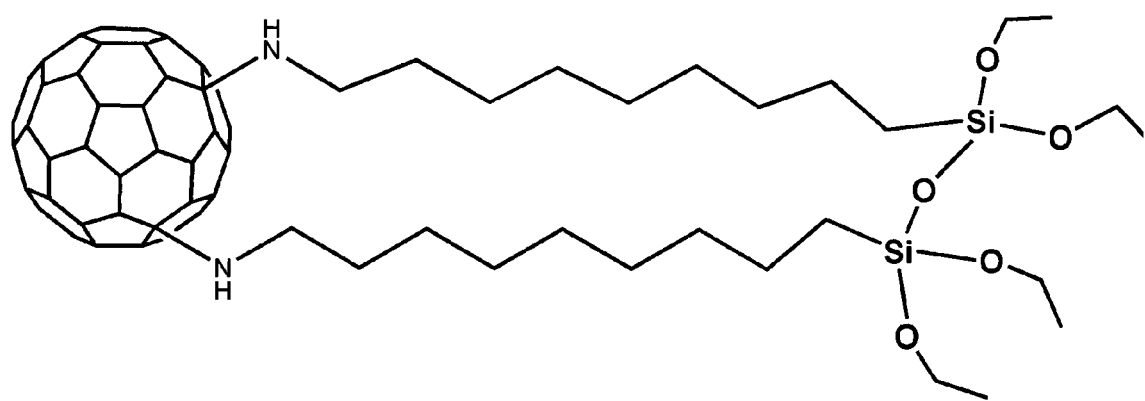
FIG. 2 shows partially condensed monomers containing long radial arms, which may lead to more linear polymeric structures.

Precondensation of organic phase monomers that have been prepared to include relatively long radial arms may induce the type of structure shown in FIG. 2 (the remaining arms of the monomer have been omitted for clarity), where two or more arms from the same monomer self-condense. This will lead to a reduced amount of crosslinking in the organic phase, and will favor linear structures. Such structures increase the likelihood of forming a continuous network throughout the composite, relative to more cluster-like morphologies.

The ratio of the matrix-forming monomer and the porogen is chosen such that each phase will exist as a continuous network conterminous with the other phase, and to give the desired amount of porosity in the final dielectric film, with the corresponding lowering of the film's dielectric constant. In one example, the organic porogen phase occupies between about 30 and about 80%, alternatively between about 50 to about 70%, of the volume of the dried composite film after deposition onto the desired substrate. Other compositions that yield a suitably strong porous film may be used.

Figure 3:
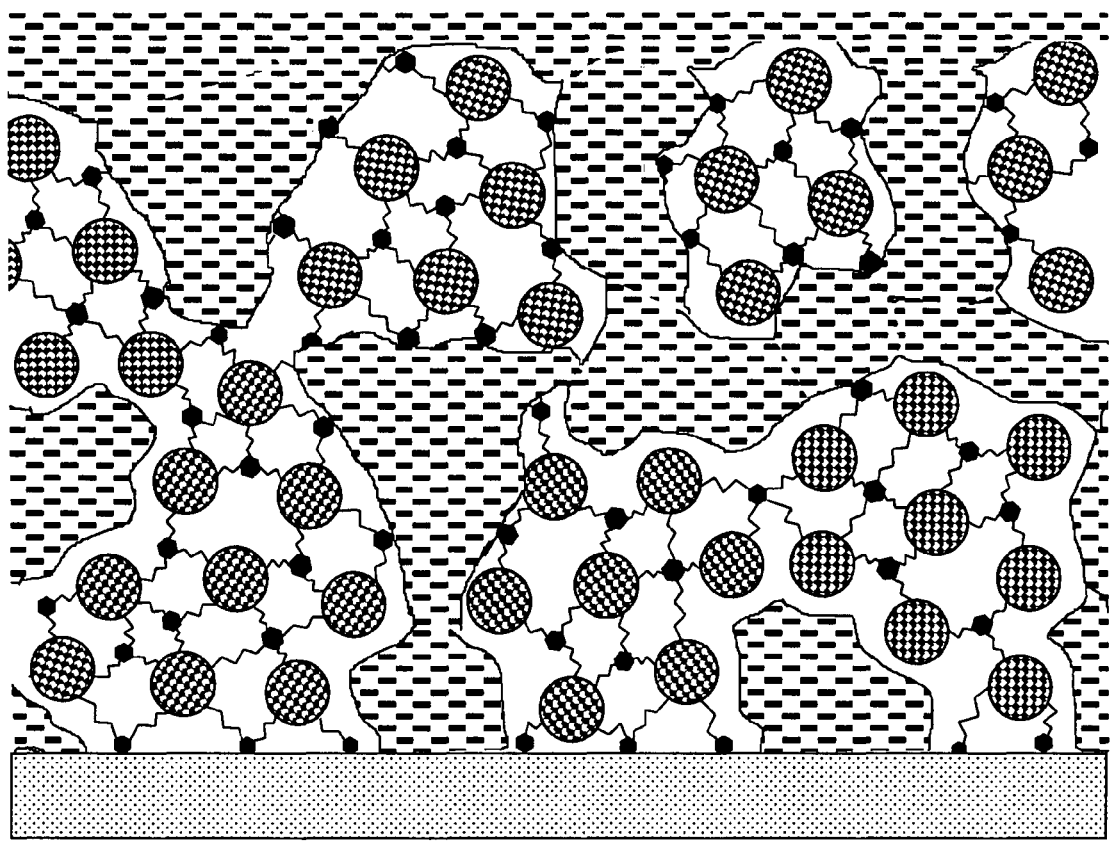
FIG. 3 shows a representation of a section of an inorganic-organic composite structure after deposition onto a solid substrate and initial curing. Fullerene cages are shown as hashed circles, junctions formed by the condensation of terminal groups of the radial arms are shown as black hexagons, the inorganic phase is shown as a dashed solid, and the solid substrate is dotted.

A solution of the organic phase precursor may be combined with a solution of the inorganic phase precursor, forming a composite film precursor solution. This solution is then applied to the desired substrate by any method commonly employed in the art, such as spin-coating, dip-coating, or spray-coating and rapidly air dried. A subsequent initial thermo-chemical curing step removes residual solvent and initiates the hydrolysis and condensation reactions of the alkoxide precursors in the inorganic phase and of the terminal alkoxide groups of the radial arms in the organic phase, crosslinking the fullerene-containing monomers, strongly linking the two phases together, and bonding the entire composite structure to the solid substrate. This step is performed at a temperature and under an atmosphere sufficient to hydrolyze and condense the contained alkoxide groups. In one example, the initial curing step is performed between about 100 and about 150° C. under an atmosphere of moist air. A section of such a composite structure on a solid substrate is shown in FIG. 3. Fullerene cages are shown as hashed circles, junctions formed by the condensation of terminal groups of the radial arms are shown as black hexagons, the inorganic phase is shown as a dashed solid, and the solid substrate is dotted.

Figure 4:
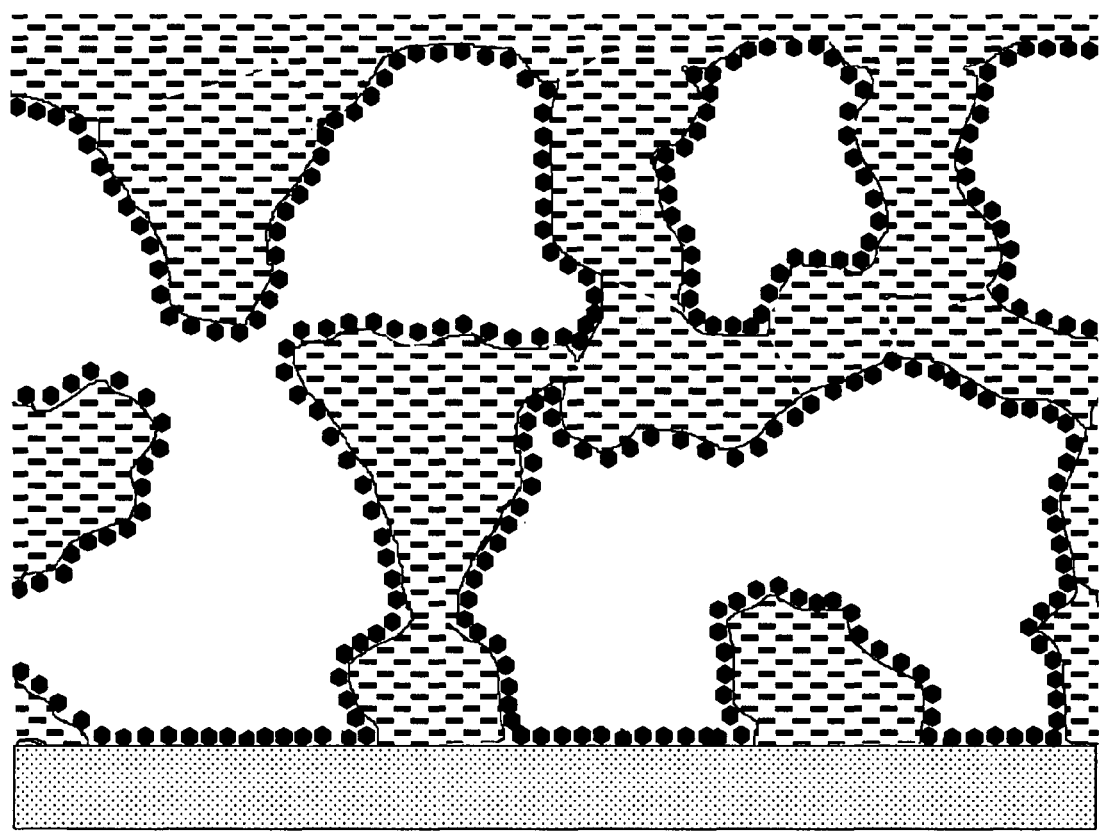
FIG. 4 shows the section of FIG. 3, after removal of the organic phase.

The organic porogen phase may be removed during a subsequent oxidation treatment. This step may consist of any common procedure used to affect the oxidation of organic materials including, but not limited to, thermal oxidation, ozonolysis, and oxygen plasma treatment. FIG. 4 shows a representation of such a porous film after removal of the porogen. In this example, only the porous network corresponding to the inorganic phase of the original composite structure remains.

The inorganic pore network may be reinforced by the deposition of residual silica left behind during the oxidation of the organic phase. The original organic phase of the composite typically contains between about 5% and about 30% by weight of silica, depending on the number and lengths of the radial arms used. This is located at or near the junction points formed by the condensation of the terminal reactive groups of the radial arms. These very small clusters, usually containing fewer than eight silicon atoms, will not be removed by any possible oxidation processes and will therefore be free to coat the newly exposed surface of the porous inorganic phase. This may result in a considerable strengthening of the remaining porous solid. The coating of the interior surface of the inorganic phase is represented by black hexagons in FIG. 4.

Figure 5:
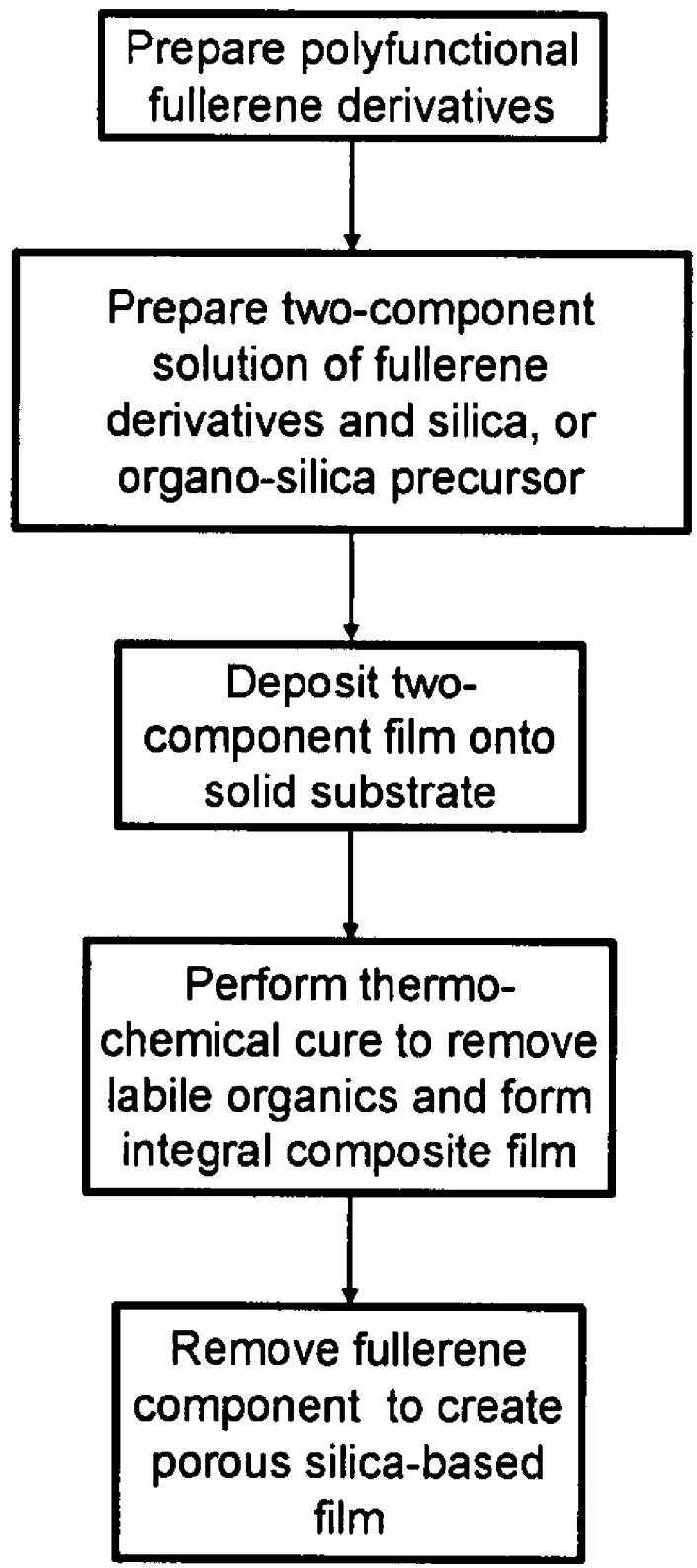
FIG. 5 shows a representation of the process steps disclosed herein.

A summary of the process steps typically contemplated according to the present disclosure appears in FIG. 5.

EXAMPLE

The following non-limiting example demonstrates the experimental conditions suitable to prepare porous films, useful as low dielectric constant materials, according to the methods described above.

A porous, inorganic film with a low dielectric constant was prepared. A composite material including an organic phase and an inorganic phase with a block copolymer structure was prepared and deposited on a silicon substrate. A solution of a polyfunctional starburst-shaped fullerene molecule to be used as a monomer for the organic phase was prepared as follows. About 5.0 grams of $C_{60}$ was mixed with about 200 mL of 6-aminohexyltriethoxysilane in a 500-mL Schlenk flask. The flask was flushed with dry nitrogen, and the mixture heated to about 60° C. for about 24 hours. During that time the mixture slowly changed from a clear liquid containing a fine black suspended powder to a dark brown solution with a moderate amount of a thick brown precipitate. The remaining 6-aminohexyltriethoxysilane was removed by vacuum distillation. This should be accomplished at the lowest possible pressure so that lower distillation temperatures may be employed. After the brown-black residue was dry, about a 2.5-gram portion was removed and dissolved in about 150 mL of anhydrous ethanol. This solution was filtered to remove any undissolved material and reserved for use in the next step.

The solution prepared as above was precondensed by the addition of about 20 μL of water, after which the solution was held at about 50° C. for 2 about 4 hours. The condensed monomers should remain in solution at this point, however if any solids form they should be removed by filtration.

The above solution of precondensed monomer was mixed with a second solution containing about 3.1 grams of poly (ethoxysilane) (6.0 mL Silbond H-5, Silbond Corp.) in about an additional 90 mL of ethanol. The composite precursor solution was quickly coated onto a 2×2-cm section of silicon wafer and allowed to air dry. The coated substrate was then heated to about 60° C. in a fused silica tube for about 30 minutes to remove residual solvent. The temperature was then increased to about 90° C. and the substrate was held at that temperature under an atmosphere of moist air for about 240 minutes. The atmosphere was then exchanged for oxygen, and the temperature above the coated substrate was increased at a rate of about 5° C./min to about 300° C. and held at that temperature for about 30 minutes. A continued increase at about 5° C./min to about 600° C. and an isothermal bake at that temperature for about 60 minutes completed the removal of the organic porogen and the curing process. The resulting film, which had lost its original brown color, contained approximately 50% porosity and exhibited excellent adhesion and scratch resistance and is well-suited for use as a low dielectric constant material.

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. A method of producing a porous film, comprising:
providing a functionalized fullerene monomer comprising at least one reactive arm;
condensing the functionalized fullerene monomer to form a partially condensed fullerene oligomer;
combining the partially condensed fullerene oligomer with an inorganic oxide precursor to form a composite mixture;
applying the composite mixture to a substrate;
curing the composite mixture; and
removing at least a portion of the partially condensed fullerene oligomer to obtain the porous film.

2. The method of claim 1, wherein the functionalized fullerene monomer comprises a fullerene and at least one reactive arm, wherein the at least one reactive arm comprises:
a reactive group coupled to the fullerene;
an organic spacer portion; and
a metal or metalloid alkoxide.

3. The method of claim 2, wherein the functionalized fullerene monomer comprises a $C_{60}$ fullerene.

4. The method of claim 2, wherein the at least one reactive arm comprises:
an amine, an azide, a diene or a carbanion;
an alkyl organic spacer portion; and
a metal or metalloid alkoxide selected from the group consisting of: —Si(OR)$_3$, —Ge(OR)$_3$, —Ti(OR)$_3$, —Zr(OR)$_3$, —Sn(OR)$_3$, —Al(OR)$_2$, and —B(OR)$_2$.

5. The method of claim 1, wherein the at least one reactive arm is selected from the group consisting of: 3-aminopropyltrimethoxysilane, 3-aminopropyltriethoxysilane, 2-aminoethyl-3-aminopropyltrimethoxysilane, 2-aminoethyl-3-aminopropyltriethoxysilane, diethylenetriaminopropyltrimethoxysilane, hexane-diaminomethyltriethoxysilane, and 11-aminoundecyltriethoxysilane.

6. The method of claim 1, wherein the condensing comprises contacting the functionalized fullerene monomer with water.

7. The method of claim 1, wherein the inorganic oxide precursor is poly(ethoxysilane).

8. The method of claim 1, wherein the applying comprises spin-coating, dip-coating or spray-coating the composite mixture.

9. The method of claim 1, wherein the curing comprises heating the composite mixture to between about 80° C. to 200° C. under a moist atmosphere.

10. The method of claim 1, wherein the removing comprises an oxidation treatment of at least a portion of the fullerene monomer.

11. The method of claim 10, wherein the removing comprises thermal oxidation, oxonolysis or oxygen plasma treatment of at least a portion of the fullerene oligomer.

12. A method of producing a porous film, comprising:
adding aminohexyltriethoxysilane to a plurality of fullerenes, wherein amino groups of the aminohexyltriethoxysilane react with the fullerenes to generate functionalized fullerenes;
adding water to the functionalized fullerenes, thereby condensing silane groups of the aminohexyltriethoxysilane to generate partially condensed fullerene oligomers;
combining the partially condensed fullerene oligomers with poly(ethoxysilane) to form a composite mixture;
applying the composite mixture to a substrate;
curing the composite mixture; and
removing at least a portion of the partially condensed fullerene oligomers to obtain the porous film.

13. The method of claim 12, wherein the applying comprises coating the composite mixture on a silicon wafer.

14. The method of claim 12, wherein the curing comprises heating the composite mixture to greater than about 80° C.

15. The method of claim 12, wherein the removing comprises heating the composite mixture to greater than about 300° C. in the presence of oxygen.

* * * * *

UNITED STATES PATENT AND TRADEMARK OFFICE
CERTIFICATE OF CORRECTION

PATENT NO. : 7,875,315 B2  
APPLICATION NO. : 11/806464  
DATED : January 25, 2011  
INVENTOR(S) : Ayers Page 1 of 1

It is certified that error appears in the above-identified patent and that said Letters Patent is hereby corrected as shown below:

Title Page 2, item (56), under "U.S. Patent Documents", in Column 1, line 59, below "2009/0192281 A1   7/2009   Ayers"
insert --

| | | |
|---|---|---|
| 4,002,800 | 1/1977 | Nestler et al. |
| 5,965,202 | 10/1999 | Taylor-Smith et al. |
| 6,113,673 | 9/2000 | Loutfy et al. |
| 2004/0005506 A1 | 1/2004 | Nishimura |
| 2004/0038408 A1 | 2/2004 | Abbott et al. |
| 2004/0121501 A1 | 6/2004 | Large et al. |
| 2004/0185448 A1 | 9/2004 | Lopez-Avila |
| 2005/0089684 A1 | 4/2005 | Barron et al. |
| 2005/0119360 A1 | 6/2005 | Kawakami et al. |
| 2006/0002875 A1 | 1/2006 | Winkler et al. --. |

Title Page 2, item (56), under "Foreign Patent Documents", in Column 2, line 25, below "JP 2005-290316 A 10/2005" insert -- WO WO 98/007793 A1 02/1998 --.

Signed and Sealed this  
Twenty-fourth Day of May, 2011

David J. Kappos  
*Director of the United States Patent and Trademark Office*